US009015528B2

(12) United States Patent
Gherman et al.

(10) Patent No.: US 9,015,528 B2
(45) Date of Patent: Apr. 21, 2015

(54) METHOD FOR THE ON-LINE TESTING OF PIPELINE STAGES TEMPORARILY NOT IN USE, AND ASSOCIATED DEVICE

(75) Inventors: Valentin Gherman, Palaiseau (FR); Yannick Bonhomme, Breuillet (FR)

(73) Assignee: Commissariat a l'Energie Atomique et aux Energies Alternatives, Paris (FR)

(*) Notice: Subject to any disclaimer, the term of this patent is extended or adjusted under 35 U.S.C. 154(b) by 253 days.

(21) Appl. No.: 13/820,589

(22) PCT Filed: Aug. 23, 2011

(86) PCT No.: PCT/EP2011/064428
§ 371 (c)(1),
(2), (4) Date: Apr. 16, 2013

(87) PCT Pub. No.: WO2012/028490
PCT Pub. Date: Mar. 8, 2012

(65) Prior Publication Data
US 2014/0149725 A1 May 29, 2014

(30) Foreign Application Priority Data
Sep. 2, 2010 (FR) ..................... 10 56965

(51) Int. Cl.
G06F 11/00 (2006.01)
G06F 11/07 (2006.01)
G06F 9/30 (2006.01)
G01R 31/28 (2006.01)
G01R 31/26 (2014.01)

(52) U.S. Cl.
CPC ........ G06F 11/0721 (2013.01); G06F 9/30021 (2013.01); G06F 2207/3884 (2013.01); G01R 31/2642 (2013.01); G01R 31/2882 (2013.01)

(58) Field of Classification Search
CPC ..................... G06F 2207/3884; G06F 9/30021
See application file for complete search history.

(56) References Cited

U.S. PATENT DOCUMENTS 5,822,557 A * 10/1998 Suetake et al. ................. 712/212
6,543,028 B1 * 4/2003 Jamil et al. ..................... 714/800
2001/0014957 A1 * 8/2001 Oura .............................. 714/33

(Continued)

OTHER PUBLICATIONS

Smitha Shyam, et al., "Ultra Low-Cost Defect Protection for Microprocessor Pipelines", Journal of Architectural Support for Programming Languages and Operating Systems, Oct. 21-25, 2006, pp. 73-82.

*Primary Examiner* — Charles Ehne
(74) *Attorney, Agent, or Firm* — Baker Hostetler LLP

(57) ABSTRACT

A method for online testing pipeline systems comprising a succession of stages separated by buffers each associated with an idle signal, or idle signal, and/or at least one status bit, comprising: detecting values of the idle signal and/or the corresponding status bits indicating the availability of a cycle or the abrupt interruption of the flow of operations in a pipeline, and indicating that a valid operation, executed by a stage in the pipeline, is followed by an unused cycle; maintaining the state of the buffer in order to allow said valid operation to be re-executed during the unused cycle indicated by said idle signal; re-executing, during the unused cycle, the valid operation, in order to obtain at least a first version and a second version of said valid operation; memorizing, at the output of the pipeline, the results that correspond to the first version of said repeated or re-executed operation, in order to compare with the results of said second version of the same repeated or re-executed operation; and comparing the results obtained at the output of the pipeline, which results correspond to the first version and the second version, and, if there is a difference, indicating an error.

18 Claims, 2 Drawing Sheets

(56) References Cited

U.S. PATENT DOCUMENTS

| | | | |
|---|---|---|---|
| 2002/0038418 A1* | 3/2002 | Shimamura | 712/245 |
| 2005/0172172 A1 | 8/2005 | Beacom et al. | |
| 2008/0141088 A1 | 6/2008 | Parulkar et al. | |
| 2009/0138772 A1 | 5/2009 | Bertacco et al. | |
| 2010/0162056 A1* | 6/2010 | Higashino | 714/718 |

* cited by examiner

METHOD FOR THE ON-LINE TESTING OF PIPELINE STAGES TEMPORARILY NOT IN USE, AND ASSOCIATED DEVICE

CROSS-REFERENCE TO RELATED APPLICATIONS

This application is a National Stage of International patent application PCT/EP2011/064428, filed on Aug. 23, 2011, which claims priority to foreign French patent application No. FR 1056965, filed on Sep. 2, 2010, the disclosures of which are incorporated by reference in their entirety.

FIELD OF THE INVENTION

The invention relates to a method for testing temporarily unused stages in a pipeline and related devices. The invention is notably applicable to the fields of micro and nanotechnology.

The invention may be used, for example, to detect timing faults that appear during production, or that are due to aging of pipelined digital circuits, or even to detect transient faults produced by interference with the environment or via the radioactivity of certain impurities in the materials forming said circuits.

BACKGROUND

The term "pipeline" denotes a digital circuit separated into a plurality of stages separated by buffers, each stage being able to execute one operation in each clock cycle. Pipelines may for example be found in processor cores or systems of interconnects. In pipelines where operations are executed in order, i.e. in the same order as that in which they are input, unused cycles pass through every stage in the pipeline between the stage where they appear and the output or outputs of the pipeline, exactly like gas bubbles propagate in a bottle of mineral water. In the following, such unused cycles in the pipeline will simply be called "bubbles". For example, in the case of a processor core, these bubbles may appear because of fetch-miss defects, nop (no operation) instructions, or branching instructions such as skip addressing.

An operation is said to be "valid" if the result of its execution has an effect on the result of a task or a program that must be executed by a pipeline system.

The term "test vector" is used to indicated the state of a buffer at the input of a pipeline stage during the test phase.

In circuits produced in micro and nanotechnology, faults resulting from physical defects due to aging may cause operating errors and eventually failure of the system. In addition, the extreme miniaturization of these circuits decreases the amount of electric charge required to change the logic level of a signal, thereby implicitly promoting the appearance of transient faults.

In digital systems produced using nanoscale technologies, current approaches that allow aging to be monitored are too costly in terms of footprint and power, or else they have a limited degree of coverage with respect to aging-related faults.

In general, most aging-related defects have the property of leading to a gradual increase in the latency of the circuit. Therefore, these defects will induce timing faults, the severity of which will gradually increase over time. It is this property that will be used to greatly decrease the latency of detection, and even enable aging-related faults to be detected and predicted.

Patent application US 2005/172172 describes a method and a device for testing pipeline systems in a microprocessor during unused cycles. The method compares a known pre-stored value with the output of the pipeline under test in order to determine if errors are present.

Patent application US 2009/138772 describes a method and a device for testing microprocessors, which also uses cycles that are unused during the operation of the microprocessors. The method uses a predefined logic value.

SUMMARY OF THE INVENTION

The subject of the invention is notably a method for testing whether a pipeline system is operating "correctly", allowing timing and/or transient faults to be detected, the method notably involving the generation and the management of test vectors in the stages in the pipeline and making use of clock cycles during which stages in the pipeline are not in use.

The invention relates to a method for online testing pipeline systems, said pipeline system comprising a succession of stages separated by buffers, each buffer being associated with an idle signal, or valid=not idle signal, and/or at least one status bit, characterized in that it comprises, in combination, at least the following steps:
a) detecting values of the idle signal and/or the corresponding status bits indicating the availability of a cycle or the abrupt interruption of the flow of operations in a pipeline, and indicating that an operation ($O_3$), called a valid operation, executed by a stage in the pipeline, is followed by an unused cycle;
b) maintaining the state of the buffer in order to allow said valid operation ($O_3$) to be re-executed during the unused cycle indicated by said idle signal;
c) re-executing, during the unused cycle, the valid operation ($O_3$), in order to obtain at least a first version ($O'_3$) and a second version ($O''_3$) of said valid operation ($O_3$);
d) memorizing, at the output of the pipeline, the results that correspond to the first version ($O'_3$) of said repeated or re-executed operation ($O_3$), in order to compare them with the results of said second version ($O''_3$) of the same repeated or re-executed operation ($O_3$); and
e) comparing the results obtained at the output of the pipeline, which results correspond to the first version ($O'_3$) and the second version ($O''_3$), and, if there is a difference, indicating the presence of an error.

The idle signal may be observed at the input of the pipeline, or at any stage in the pipeline.

In step b), the last valid operation before an unused cycle is, for example, re-executed in a plurality of successive cycles.

The first instance of a repeated operation may be executed in degraded mode.

The operation d) of memorizing the values obtained by the various instances of a repeated operation is executed using a duplicated buffer, at the output of the pipeline.

The comparison operation is, for example, executed at the output of each of the stages forming the pipeline.

According to one variant, an unused cycle or bubble is inserted at the input of the pipeline after each operation that is not naturally followed by an unused cycle and the results of each operation are checked at the output of the pipeline or at each of the stages in the pipeline.

Naive coding may be used to encode the information that describes the type of operation executed by each stage in the pipeline, defined as follows: a status bit is associated with each buffer, except the first buffer in the pipeline, such that the status bit of a buffer at the input of a stage executing an operation that corresponds to a re-execution of the operation in the preceding stage takes the value s'∈{0, 1}, and s=not(s') in any other case.

In the case where comparison step e) is carried out at the output of the pipeline, the method uses an additional flip-flop associated with the output buffer, said additional flip-flop storing the status bit of this buffer during the preceding cycle.

According to one variant, it is possible to use two status bits in the case where operations are repeated more than twice, in order to distinguish between unrepeated operations and the first version, the following versions and the last version of a repeated operation, each of the status bits possibly being separately coded.

The method may be used for pipelines in the cores of processors where temporarily unused cycles are obtained by inserting operations of the "no operation" type, or for pipelines in interconnect systems where the status bits are shifted forward by one pipeline stage, or even for pipelines in interconnect systems where temporarily unused cycles are included in management tables or are generated by a central arbiter.

The invention also relates to an online testing device for pipeline systems composed of a succession of stages separated by buffers, noteworthy in that it comprises at least the following elements: a means for naive coding the types of operation carried out in the stages in said pipeline, indicating the duplicated operations and their versions, consisting of a status bit associated with each buffer at the end of a pipeline stage such that the status bit of a buffer at the input of a stage executing an operation that corresponds to a re-execution in the preceding stage takes the value s'∈{0, 1}, and s=not(s') in any other case, in order to select the degraded mode for the buffers at the end of each pipeline stage that executes the first version of a duplicated operation; means for comparing the results; and means for choosing between the results produced by two versions of a duplicated operation.

The device may comprise a flip-flop for storing each status bit.

According to one embodiment of the device, the status bit s' takes the value {s, s'}, the status bit s=not(s') takes the value {s', s}, each pair of status bits being obtained from a signal indicating the absence of a valid operation at the input of the pipeline and from this same signal inverted by an inverter, and said device comprises means allowing the appearance of the combination (s, s') to be identified in order to select the degraded mode for the buffers at the end of each pipeline stage that executes the first version of a duplicated operation, means for comparing the results, and means for choosing between the results produced by two versions of a duplicated operation.

The means for identifying the appearance of the combination (s, s') are, for example, chosen from the list of following means: AND logic gates if the parameter s is equal to 0, or NOR logic gates when s=1.

The information conveyed by the status bit associated with a buffer may be read by comparing it with the status bit of the following buffer, the value of the first status bit in the pipeline during a clock cycle being obtained by comparing its value during the preceding clock cycle with the input signal indicating the absence of a valid operation at the input of the pipeline, and it comprises XOR logic gates and logic inverters allowing duplicated operations and their versions to be identified in order to select the degraded mode for buffers at the end of each pipeline stage that executes the first version of a duplicated operation, the results to be compared, and the results produced by the two versions of a duplicated operation to be chosen between.

According to one embodiment, a buffer comprises double the number of status bits in the case where the operations are repeated more than twice, in order to distinguish between unrepeated operations and the first version, the following versions and the last version of a repeated operation, each of the status bits possibly being separately coded.

BRIEF DESCRIPTION OF THE DRAWINGS

Other features and advantages of the invention will become more clearly apparent from the following description, given merely by way of nonlimiting illustration, and with regard to the appended drawings, in which.

DETAILED DESCRIPTION

Basic Principle

Figure 1:
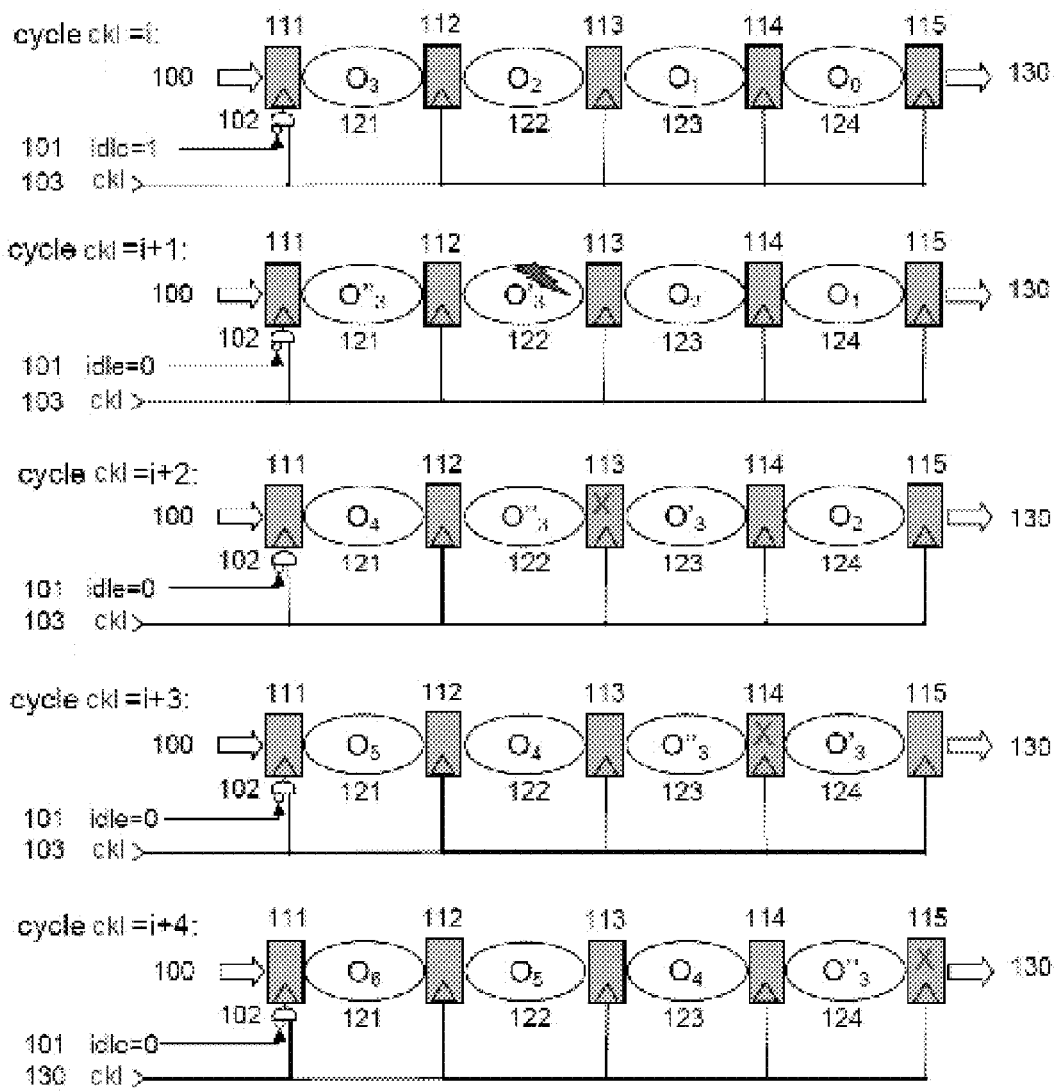
FIG. 1 shows one embodiment of the test method according to the invention, using temporarily unused stages in a pipeline.

The example given in FIG. 1 shows an example of a method for testing the correct operation, according to the invention, of stages in a pipeline. In this FIG. 1, the state of the pipeline has been shown for 5 clock cycles, arranged by cycle or clk, referenced starting with i, i+1, . . . i+4.

FIG. 1 shows the method for testing unused stages in a pipeline consisting of four combinational stages 121, 122, 123 and 124, each of the stages being separated by a buffer 112, 113 and 114, respectively. Two additional buffers 111 and 115 are placed at the input and output, respectively, of the pipeline.

The "idle" signal corresponds to a mechanism known from the prior art, which mechanism indicates, at the input of a pipeline or at any other stage in the pipeline, whether a new operation is available or not. Thus, the absence of a new valid operation is indicated, for example, by the signal 101 (idle). The signal 101 is used to block the first buffer 111, for example, of the pipeline in order to allow the re-execution of an operation to be initiated according to the characterizing steps of the test method according to the invention. The fact that the first buffer of the pipeline is blocked is symbolized in this embodiment by the gate 102 that implements the AND logical operator and receives, as inputs, the inverted (idle) signal 101 and a clock signal 103.

This mechanism may also be used in all the stages of the pipeline in order to be able to handle, at any moment, the appearance of an invalid operation.

Without departing from the scope of the invention, other types of signal, which indicate abrupt interruption of the flow of operations in a pipeline, may be used in order to indicate the appearance of a bubble inside the pipeline. These signals may block all the buffers 111, 112, 113 and 114.

The test method proposed according to the invention is based on re-execution of the last operation executed before an unused cycle in one or more stages in the pipeline. Such a situation is illustrated in FIG. 1 where, during the cycle clk=i the signal idle=1 indicates that the operation $O_3$ executed by the first stage of the pipeline will be followed by an unused cycle, or, in other words, by an invalid instruction. Instead of detecting values of the idle signal, it is possible to detect corresponding status bits indicating that an operation $O_3$ executed by a stage in the pipeline, called a valid operation, is followed by an unused cycle.

Re-execution of an operation during an unused cycle, the operation $O_3$ in this example, by the same hardware, in successive cycles i+1, i+2, i+3, ..., notably allows timing faults, and implicitly most defects due to aging of the pipeline-related circuit or device, to be detected.

In this example, the operations $O_2$ and $O_3$ provide a pair of vectors for testing timing faults in the stages implemented. The operation $O_2$ initializes the timing faults (initialization vector), whereas the operation $O_3$ provides an activation vector during the following cycle. The response of each stage of the pipeline to this pair of test vectors is checked by re-executing the operation $O_3$. $O_3$ is repeated or re-executed (because of its re-execution during the unused cycle) and becomes a first version $O'_3$, 122, and a second version $O''_3$, 121, of said valid operation $O_3$. By releasing the buffer in clock cycle ckl=i+1 and in the following cycles, the operations $O_4$, $O_5$, $O_6$ then take place. At the output of the pipeline, the results of the first version $O'_3$ will be memorized in order to be compared with the results of the second version $O''_3$.

If an error appears during execution of one of the instances of a repeated or re-executed operation, it will propagate as far as the output of the pipeline unless logical masking prevents it.

For example, FIG. 1 shows an error that appears in the second stage 122 (symbolized by a lightning bolt E in the combinatorial part, then by a cross in the buffer part 113 in cycle ckl=i+2) and that arrives at the output of the pipeline 115 after three additional cycles ckl=i+2, ckl=i+3, ckl=i+4 (not shown in the figure).

In order to allow the results produced by the various instances of a repeated operation, such as $O_3$, to be compared, one way of proceeding consists in duplicating the output buffer 115. This duplication allows the result $ROi_{1st}$ of the first execution of a repeated operation to be stored and compared with the result $ROi_{2nd}$ of the other repeated execution.

This solution makes it possible to reduce the cost of implementing the invention, but may also decrease coverage of timing faults due to logical masking which may prevent propagation of the effects of a fault from one stage to another. This logical masking is minimal in the pipeline of an interconnect system, but it may become significant in the pipeline of a processor core.

Variant with Comparison at the Output of Each Stage

In order to maximize the degree of coverage, the results of the various versions of a repeated operation may be compared at the output of each stage. In this example, to carry out this check, an XOR logic gate is necessary to compare the output and input of each flip-flop in the buffers at the output of each stage. In the latter case, the duplication of the last buffer 115 in the pipeline is no longer necessary.

Variant with Implementation in Degraded Mode

According to one embodiment allowing errors due to timing faults to be predicted, the first instance of the operation $O_3$ is executed in degraded mode, i.e. in a mode where the time window in which late arrival of signals at the outputs of the stages in the pipeline that execute this operation will be tolerated is smaller. This degradation increases the probability that a timing fault induced by an aging defect will affect the repeated operations from the word go. The degraded mode is not a subject of this patent. An example of a degraded mode is given in a patent application of the Applicant filed on the same day as the present application, or even in the publication by S. Shyam et al. entitled "Ultra low-cost defect protection for microprocessor pipelines", published in the journal "Architectural Support for Programming Languages and Operating Systems", pp. 73-82, 2006.

Protection from Transient Faults

In order to ensure protection from transient faults, which are intrinsically unpredictable, one variant embodiment of the method according to the invention protects each operation.

To obtain this result, bubbles are inserted at the input of the pipeline after each operation that is not naturally followed by a bubble. This enables systematic re-execution of the operations at every stage in their journey through the pipeline. As each operation may be checked, at the latest, at the output of the pipeline, the detection latency is almost inexistent, and it is no longer essential to use the degraded mode. It thus becomes possible to systematically check the results of each operation, and to obtain an almost inexistent detection latency for transient faults and timing faults.

Increasing the Degree of Coverage During Execution of Test Programs

Systematically repeating and checking instructions may also be used during execution of programs for testing processors in order to increase the observability of faults and implicitly their degree of coverage. In this case as well, executing the first instance of each repeated instruction in degraded mode allows potential errors to be predicted.

According to an embodiment of the test method, the degree of coverage of timing faults is increased by voluntarily introducing bubbles into a pipeline protected by this method. For example, in the case of pipelines in processor cores, this increase may be achieved by inserting nop (no operation) operations into the executed programs. In the case of pipelined interconnect systems, artificial bubbles may be inserted (a) in communication management tables that are present in certain architectures or (b) by a central arbiter when the latter is available, these technologies being known in the art.

Corrections

In order to ensure that it is possible to make a suitable correction in the case of an error, the results of the repeated operations must always be checked before irreversible changes, such as writing or updating data, are made outside of the pipeline. In order to be able to distinguish transient faults and timing faults, in the case of an error, a re-execution must start with the operation that precedes the failed operation. The results produced by the first instances of an operation may only be used inside the pipeline or for reversible changes, such as the reading of data, made outside the pipeline. The first instance of an operation may, for example, be used to read data outside of the pipeline, and the results of the last instance for any other action.

DESCRIPTION OF VARIOUS EMBODIMENTS

Implementation of the test method according to the invention requires a device that is designed to execute the operations described above and to indicate the presence of repeated operations, notably:

- it must identify cycles when the outputs of the pipeline (or each stage) must be checked;
- it must identify cycles when the outputs of the pipeline (or each stage) can be used; and
- it must deliver control signals that allow the first instance of a repeated operation to be executed in degraded mode.

Figure 2:
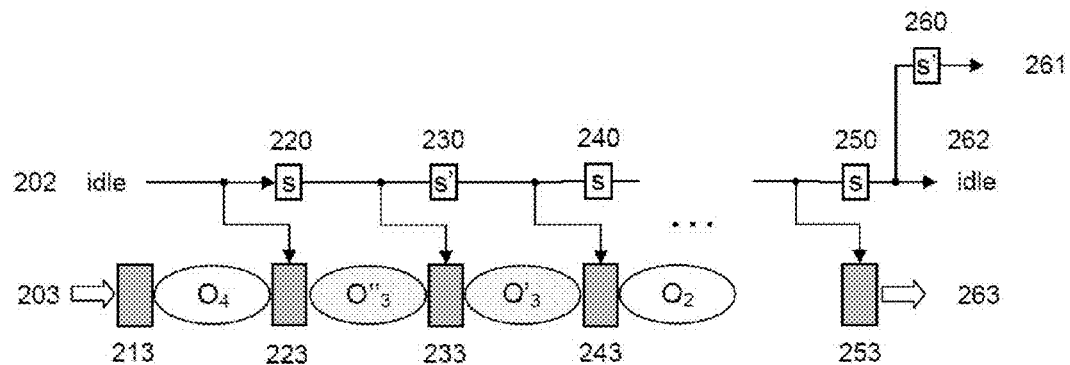
FIG. 2 shows a device with naive coding of information that allows two types of operation in the stages of a pipeline to be distinguished.
Figure 3:
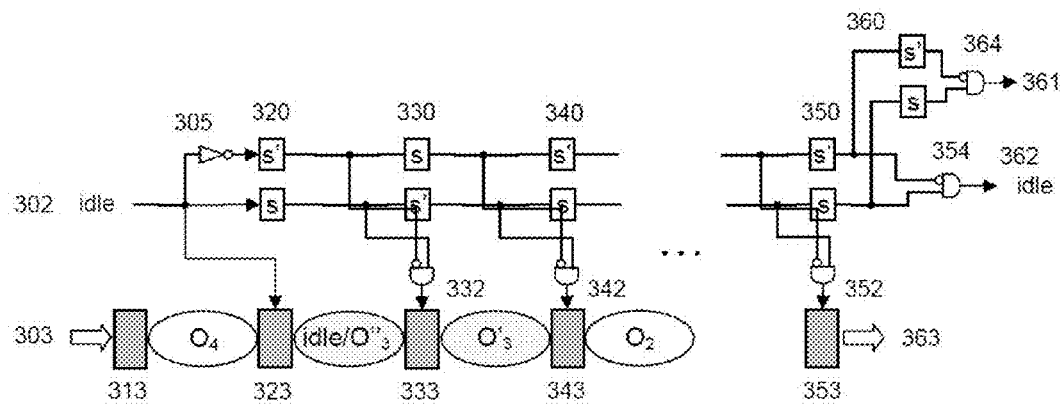
FIG. 3 shows a device with coded information that allows two types of operation in the stages of a pipeline to be distinguished, which is robust against timing faults and transient faults but that is twice as expensive as the device in FIG. 2.
Figure 4:
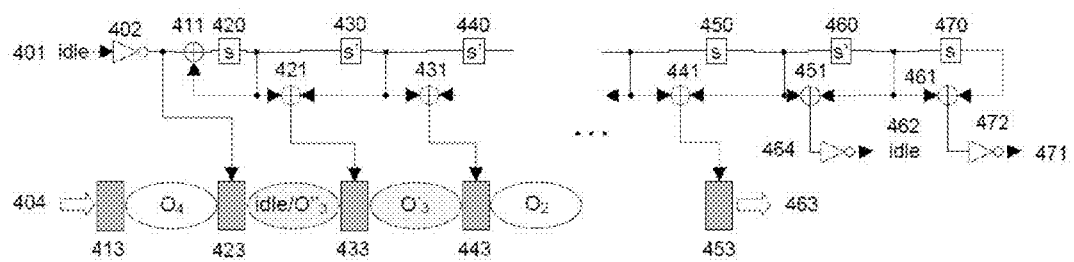
FIG. 4 shows a device with coded information that allows two types of operation in the stages of a pipeline to be distinguished, which is robust against timing faults and transient faults and that costs the same as the device in FIG. 2.

FIGS. 2, 3 and 4 show various embodiments of devices that meet at least the above criteria in the case where the repeated operations are repeated with only two instances.

FIG. 2 shows a device in which the various types of operation carried out in the stages of a pipeline are encoded with naive coding, which indicates the operations that are repeats of preceding operations. As a status bit is necessary for each buffer (except for the first), the cost is that of a single flip-flop (220, 230, 240 and 250) per buffer, in addition to the connections that allow status bits to be transferred from one buffer (223, 233, 242 and 253) to another. Status bits are transferred from one buffer to another. Only the first status bit is generated from the "idle" signal at the input of the pipeline. The status bit 220 is generated by the (idle) signal 202, which, for example, indicates the absence of a valid operation at the input of the pipeline.

With this coding, the status bit stored in the buffer at the input of a stage executing an operation that is re-executed in the preceding stage has a value $s' \in \{0, 1\}$. In any other case, the status bit takes the value s=not(s'), where the symbol "not" represents an operator that performs a logical negation.

The status bit associated with a buffer of the pipeline may be used to control whether the degraded mode is used in the following buffer. In the case of the second buffer 223, it is the (idle) signal 202 at the input of the pipeline that controls the degraded mode. The value s' of a status bit or of the signal 202 indicates whether the buffer in question must operate in degraded mode. The degraded mode does not need to be implemented in the first buffer 213 of the pipeline for the internal logic of the corresponding stage of the pipeline to be protected.

The status bit of a flip-flop associated with an output buffer indicates the validity of the contents of the buffer. In FIG. 2, this is the case of status bit 250, which delivers the validity signal 262 for the output 263 of buffer 253.

The s' value of the status bit associated with a buffer of the pipeline also indicates whether the inputs and outputs of this buffer should be identical. This indication is useful in the case where comparison of the results produced by the various versions of a repeated operation must be compared with the results obtained by the preceding versions at the output of each stage of the pipeline.

In the case where this comparison is carried out only at the outputs of the pipeline, each output buffer requires an additional flip-flop in order to store the status bit of this buffer during the preceding cycle. This is the case for the flip-flop 260, which produces, at its output, the signal 261, this signal having a value equal to s' if the output 263 must be compared.

FIG. 3 shows a device with the same type of coding as that shown in FIG. 2, except that the value s is replaced by the pair (s', s) and the value s' by the pair (s, s'). The two status bits 320 are obtained from the (idle) signal 302, which indicates the absence of a valid operation at the input of the pipeline, and from the inverse of this signal produced by the inverter 305. It will be obvious to those skilled in the art that the inverter 305 may be placed at the input of the other flip-flop associated with the buffer 323 in order to inverse the coding of the status bits. The gates 332, 342 and 352 allow the appearance of the combination of status bits (s, s') to be identified in order to enable selection of the degraded mode for the buffers 333, 343 and 353. The degraded mode is selected for the buffer 323 via the (idle) input signal 302. The logic gate 354 delivers the (idle) validity signal 362 for the output 363 of the buffer 353. The status bits 330, 340, 350 propagate from one buffer to another, as described above.

As in the preceding figure, and also in the following figure, the status bits propagate from one buffer to another.

The two status bits 350 produce two status bits 360 that are transmitted to a logic gate 364, which produces, at its output, a signal 361 indicating when the output 363 must be compared.

The gates 332, 342, 352, 354 and 364 may be AND logic gates if the parameter s is equal to 0 or NOR logic gates in the contrary case (s=1). The first input of these gates is inverted.

The combination (s, s') of the status bits associated with a buffer of the pipeline also indicates whether the inputs and outputs of this buffer should be identical. This indication is useful in the case where the comparison of results produced by the various versions of a repeated operation must be compared at the output of each stage of the pipeline.

This coding protects the encoded information from transient faults and timing faults, but it doubles the number of hardware components required.

FIG. 4 shows a device in which the various types of operation carried out in the stages of a pipeline are encoded with coding that provides the same protection of the status bits from transient faults and timing faults as the coding in FIG. 3, but at the same cost as the coding described with regard to FIG. 2. With this coding, if a stage executes an operation that is a repeat of the operation that is re-executed in the preceding stage, then the status bits stored in the buffers at the input and output of this stage should have the same value. In any other case, the two values should be different. The status bit 420 in the second buffer of the pipeline is generated by the (idle) signal (401), which indicates the absence of a valid operation at the input of the pipeline. Before being used, the signal 401 must first pass through a logic inverter 402.

The combinations (s', s') or (s, s) of the status bits associated with the input and output buffers of a stage indicate that the second buffer must receive the result in degraded mode and that the inputs and outputs of the first buffer should be identical. In the case of the last buffer, the second indication is delivered by comparing status bits in the flip-flops 450 and 460. The second indication is useful in the case where comparison of the results produced by the various versions of a repeated operation must be compared at the output of each stage of the pipeline.

The gates 411, 421, 431, 441, 451 and 461 implement the XOR operation. Gate 411 is used to generate the status bit (420) associated with the second buffer (423) of the pipeline. The bit 420 will change value in the following cycle only if the idle signal (401) at the input of the pipeline is set to a logic value of zero. The gates 421, 431 and 441 deliver signals allowing the degraded mode to be selected for buffers 433, 443 and 453. The degraded mode is selected for the buffer 423 using the (idle) input signal 401. The logic gate 451 and the inverter 464 deliver the (idle) validity signal 462 to the output 464 of the buffer 453. The logic gate 461 and the inverter 472 produce the signal 471 indicating when the output 463 must be compared.

The modifications that would be required to the devices in FIGS. 2, 3 and 4, if the 'idle' signals at the inputs and/or outputs of the pipeline were replaced by 'valid' signals, which are the inverse of 'idle' signals (valid=not(idle)), should be obvious to those skilled in the art.

In the case where the operations may be repeated more than two times it is necessary to provide each buffer in the pipeline with an additional status bit, in order to distinguish between unrepeated operations and the first version, the following versions and the last version of a repeated operation. Each status bit in a buffer of the pipeline may be separately encoded with one of the coding strategies shown in FIGS. 2 to 4. Additional repetition of operations beyond duplication allows the power consumed when unused cycles occur in succession, one after the other, to be limited.

It should be obvious to those skilled in the art how to extend the devices described in FIGS. 2 to 4 in order to implement pipelines with several status bits per buffer.

In the case of the pipeline of an interconnect system where the time it takes for the status bits of a buffer to propagate to the following buffer is comparable to the latency of a stage of the pipeline, the status bits must be shifted forward by one stage relative to the coding shown in FIG. 2, 3 or 4.

The invention claimed is:

1. A method for online testing pipeline systems, said pipeline system comprising a succession of stages separated by buffers, each buffer being associated with an idle signal, or valid=not idle signal, and/or at least one status bit, comprising:
   a) detecting values of the idle signal and/or the corresponding status bits indicating the availability of a cycle or the abrupt interruption of the flow of operations in a pipeline, and indicating that an operation ($O_3$), called a valid operation, executed by a stage in the pipeline, is followed by an unused cycle;
   b) maintaining the state of the buffer in order to allow said valid operation ($O_3$) to be re-executed during the unused cycle indicated by said idle signal;
   c) re-executing, during the unused cycle, the valid operation ($O_3$), in order to obtain at least a first version ($O'_3$) and a second version ($O''_3$) of said valid operation ($O_3$);
   d) memorizing, at the output of the pipeline, the results that correspond to the first version ($O'_3$) of said repeated or re-executed operation ($O_3$), in order to compare them with the results of said second version ($O''_3$) of the same repeated or re-executed operation ($O_3$); and
   e) comparing the results obtained at the output of the pipeline, which results correspond to the first version ($O'_3$) and the second version ($O''_3$), and, if there is a difference, indicating the presence of an error.

2. The method as claimed in claim 1, wherein, in step b), the last valid operation before an unused cycle is re-executed in a plurality of successive cycles.

3. The method as claimed in claim 1, wherein the first instance of a repeated operation is executed in degraded mode.

4. The method as claimed in claim 1, wherein the operation d) of memorizing the values obtained by the various instances of a repeated operation is executed using a duplicated buffer, at the output of the pipeline.

5. The method as claimed in claim 1, wherein the comparison operation is executed at the output of each of the stages forming the pipeline.

6. The method as claimed in claim 1, wherein an unused cycle or bubble is inserted at the input of the pipeline after each operation that is not naturally followed by an unused cycle and the results of each operation are checked at the output of the pipeline or at each of the stages in the pipeline.

7. The method as claimed in claim 1, wherein naive coding is used to encode the information that describes the type of operation executed by each stage in the pipeline, defined as follows: a status bit is associated with each buffer, except the first buffer in the pipeline, such that the status bit of a buffer at the input of a stage executing an operation that corresponds to a re-execution of the operation in the preceding stage takes the value $s' \in \{0, 1\}$, and $s=\text{not}(s')$ in any other case.

8. The method as claimed in claim 1, wherein, in the case where comparison step e) is carried out at the output of the pipeline, the method uses an additional flip-flop associated with the output buffer, said additional flip-flop storing the status bit of this buffer during the preceding cycle.

9. The method as claimed in claim 7, wherein two status bits are used in the case where operations are repeated more than twice, in order to distinguish between unrepeated operations and the first version, the following versions and the last version of a repeated operation, each of the status bits possibly being separately coded.

10. The use of the method as claimed in claim 1 for pipelines in the cores of processors where temporarily unused cycles are obtained by inserting operations of the "no operation" type.

11. The use of the method as claimed in claim 1 for pipelines in interconnect systems where the status bits are shifted forward by one pipeline stage.

12. The use of the method as claimed in claim 1 for pipelines in interconnect systems where temporarily unused cycles are included in management tables or are generated by a central arbiter.

13. An online testing device for pipeline systems composed of a succession of stages separated by buffers, said online testing device being capable of implementing the method as claimed in claim 1, further comprising: a means for naive coding the types of operation carried out in the stages in said pipeline, indicating the duplicated operations and their versions, consisting of a status bit associated with each buffer at the end of a pipeline stage such that the status bit of a buffer at the input of a stage executing an operation that corresponds to a re-execution in the preceding stage takes the value $s' \in \{0, 1\}$, and $s=\text{not}(s')$ in any other case, in order to select the degraded mode for the buffers at the end of each pipeline stage that executes the first version of a duplicated operation; means for comparing the results; and means for choosing between the results produced by two versions of a duplicated operation.

14. The device as claimed in claim 13, further comprising a flip-flop for storing each status bit.

15. The device as claimed in claim 14, wherein the status bit s' takes the value $\{s, s'\}$, the status bit $s=\text{not}(s')$ takes the value $\{s', s\}$, each pair of status bits being obtained from a signal indicating the absence of a valid operation at the input of the pipeline and from this same signal inverted by an inverter, and in that it comprises means allowing the appearance of the combination (s, s') to be identified in order to select the degraded mode for the buffers at the end of each pipeline stage that executes the first version of a duplicated operation, means for comparing the results, and means for choosing between the results produced by two versions of a duplicated operation.

16. The device as claimed in claim 15, wherein the means for identifying the appearance of the combination (s, s') are chosen from the list of following means: AND logic gates if the parameter s is equal to 0, or NOR logic gates when s=1.

17. The device as claimed in claim 14, wherein the information conveyed by the status bit associated with a buffer is read by comparing it with the status bit of the following buffer, the value of the first status bit in the pipeline during a clock cycle being obtained by comparing its value during the preceding clock cycle with the input signal indicating the absence of a valid operation at the input of the pipeline, and in that it comprises XOR logic gates and logic inverters allowing duplicated operations and their versions to be identified in order to select the degraded mode for buffers at the end of each pipeline stage that executes the first version of a duplicated operation, the results to be compared, and the results produced by the two versions of a duplicated operation to be chosen between.

18. The device as claimed in claim 13, wherein a buffer comprises double the number of status bits in the case where the operations are repeated more than twice, in order to distinguish between unrepeated operations and the first version, the following versions and the last version of a repeated operation, each of the status bits possibly being separately coded.

\* \* \* \* \*